US010939566B2

(12) United States Patent
Best

(10) Patent No.: US 10,939,566 B2
(45) Date of Patent: Mar. 2, 2021

(54) ELECTRONICS HOUSING FOR HOUSING AN ELECTRONICS COMPONENT

(71) Applicant: Phoenix Contact GmbH & Co. KG, Blomberg (DE)

(72) Inventor: Frank Best, Bueckeburg (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 0 days.

(21) Appl. No.: 16/492,621

(22) PCT Filed: Mar. 20, 2018

(86) PCT No.: PCT/EP2018/057059
§ 371 (c)(1),
(2) Date: Sep. 10, 2019

(87) PCT Pub. No.: WO2018/172373
PCT Pub. Date: Sep. 27, 2018

(65) Prior Publication Data
US 2020/0053888 A1    Feb. 13, 2020

(30) Foreign Application Priority Data
Mar. 21, 2017   (BE) .................... 2017/5182

(51) Int. Cl.
*H05K 5/00*     (2006.01)
*H05K 7/14*     (2006.01)

(52) U.S. Cl.
CPC ........... *H05K 5/006* (2013.01); *H05K 5/0008* (2013.01); *H05K 5/0052* (2013.01); *H05K 7/1417* (2013.01); *H05K 7/1427* (2013.01)

(58) Field of Classification Search
CPC .... H05K 5/0008; H05K 5/0052; H05K 5/006; H05K 7/1417; H05K 7/1427
See application file for complete search history.

(56) References Cited

U.S. PATENT DOCUMENTS 4,969,065 A * 11/1990 Petri ..................... F16B 5/0233
                                                   174/138 D
5,848,718 A * 12/1998 Colwell ................. H02G 3/081
                                                   220/4.02
(Continued)

FOREIGN PATENT DOCUMENTS

CN        204558657 U    8/2015
DE          4215041 A1   11/1992
(Continued)

OTHER PUBLICATIONS

English Translation of DE 29723154 (Year: 1998).*

*Primary Examiner* — Abhishek M Rathod
(74) *Attorney, Agent, or Firm* — Leydig, Voit & Mayer, Ltd.

(57) ABSTRACT

An electronic housing for housing an electronic component includes: a housing body having an upper housing part and a lower housing part, between which a receiving space for the electronic component is formed. The electronic component is held in the receiving space by a holding device. The holding device includes at least one holding body with a holding arm. The holding arm projects at least in sections from outside the receiving space into the receiving space and provides a holding section for holding the electronic component.

16 Claims, 4 Drawing Sheets

(56) References Cited

U.S. PATENT DOCUMENTS

| | | |
|---|---|---|
| 6,168,452 B1 | 1/2001 | Lai et al. |
| 2004/0120125 A1 | 6/2004 | Taylor et al. |
| 2007/0114194 A1 | 5/2007 | Luo et al. |
| 2010/0246147 A1* | 9/2010 | Qin .................. H05K 7/142 |
| | | 361/758 |

FOREIGN PATENT DOCUMENTS

| | | |
|---|---|---|
| DE | 19811727 A1 | 9/1999 |
| DE | 29723154 U1 | 10/1999 |
| DE | 20004261 U1 | 1/2001 |
| EP | 1361783 A1 | 11/2003 |

* cited by examiner

ELECTRONICS HOUSING FOR HOUSING AN ELECTRONICS COMPONENT

CROSS-REFERENCE TO PRIOR APPLICATIONS

This application is a U.S. National Phase application under 35 U.S.C. § 371 of International Application No. PCT/EP2018/057059, filed on Mar. 20, 2018, and claims benefit to Belgian Patent Application No. BE 2017/5182, filed on Mar. 21, 2017. The International Application was published in German on Sep. 27, 2018 as WO/2018/172373 under PCT Article 21(2).

FIELD

The invention relates to an electronics housing for housing an electronic component.

BACKGROUND

An electronics housing of the type in question has a housing body which in turn has at least one upper housing part and a lower housing part, between which a receiving space for the electronic component is formed. In such housings, the electronic component is held in the receiving space by means of a holding device.

Here an electronic component can, for example and in particular, be a printed circuit board (often also referred to as a circuit board) with which, for example, an electronic computer device, for example a so-called "single-board computer", is realized. In such a single-board computer, a computer device is entirely accommodated on a single printed circuit board which can be housed in the electronics housing of the type in question in order to provide in this way a computer device of compact design.

Electronics housings of the type in question are known, for example, from DE 200 04 261 U1, in which upper and lower housing parts are to be attached to each other in order to produce the housing body, the housing body having on one side a front plate which is arranged between the upper and lower housing parts.

Furthermore, US 2007/0114194 A1 discloses holding means which are used for arranging a printed circuit board on the upper or lower housing part of the housing body in order to be able to ultimately house said printed circuit board by means of the housing body of a housing.

Furthermore, holding means are known from DE 198 11 727 A1, wherein a first pair of cross-members is to be fixed to the upper or lower housing part. A second pair of cross-members is adjustably guided on the first pair of cross-members by means of supports. An electronic component, for example in the form of a printed circuit board, can be held on the second pair of cross-members.

SUMMARY

In an embodiment, the present invention provides an electronic housing for housing an electronic component, comprising: a housing body having an upper housing part and a lower housing part, between which a receiving space for the electronic component is formed, wherein the electronic component is held in the receiving space by a holding device, wherein the holding device comprises at least one holding body with a holding arm, and wherein the holding arm projects at least in sections from outside the receiving space into the receiving space and provides a holding section configured to hold the electronic component.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
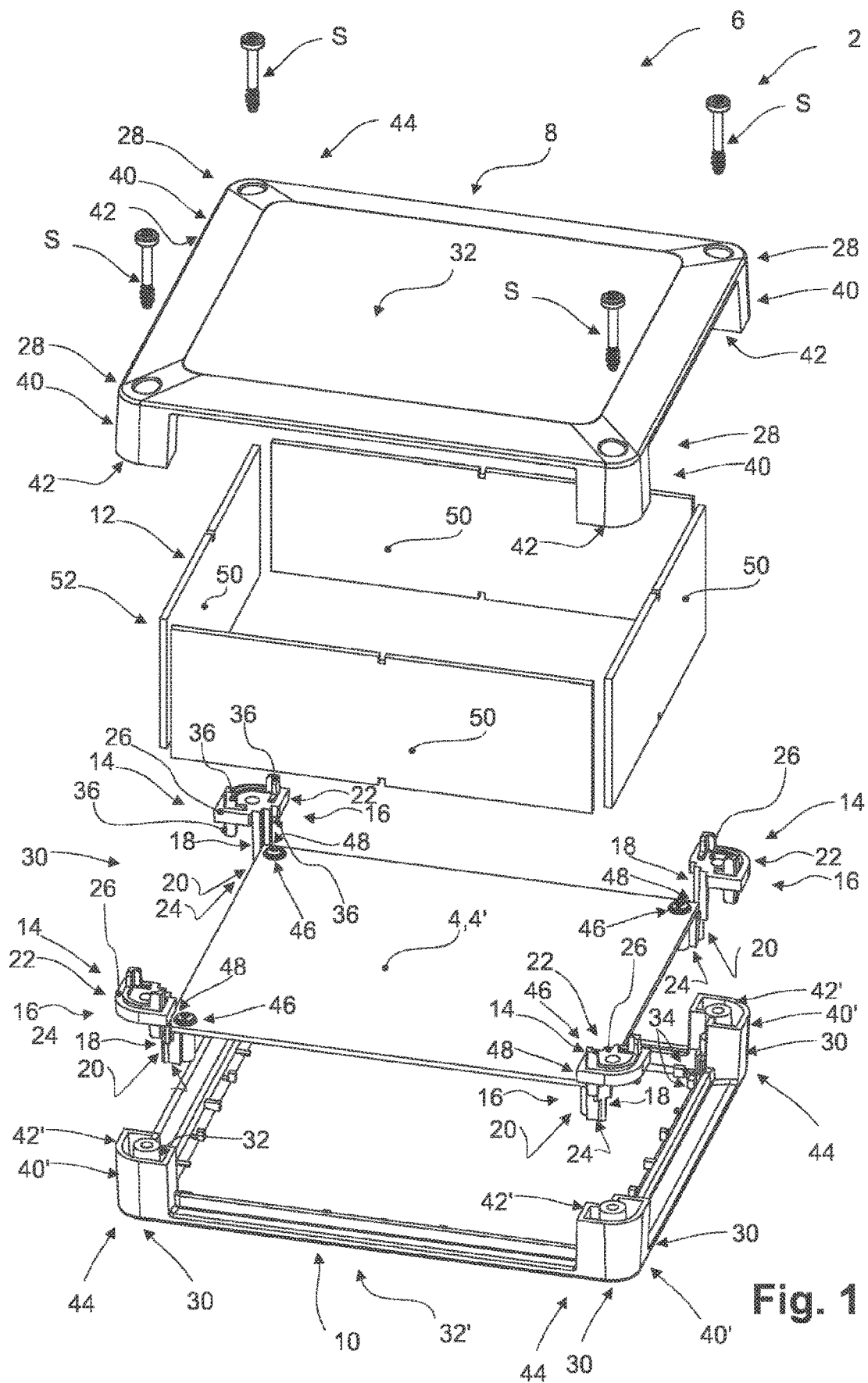
FIG. 1 shows an exemplary embodiment of an electronics housing according to the invention in a perspective and schematic exploded view.
Figure 2:
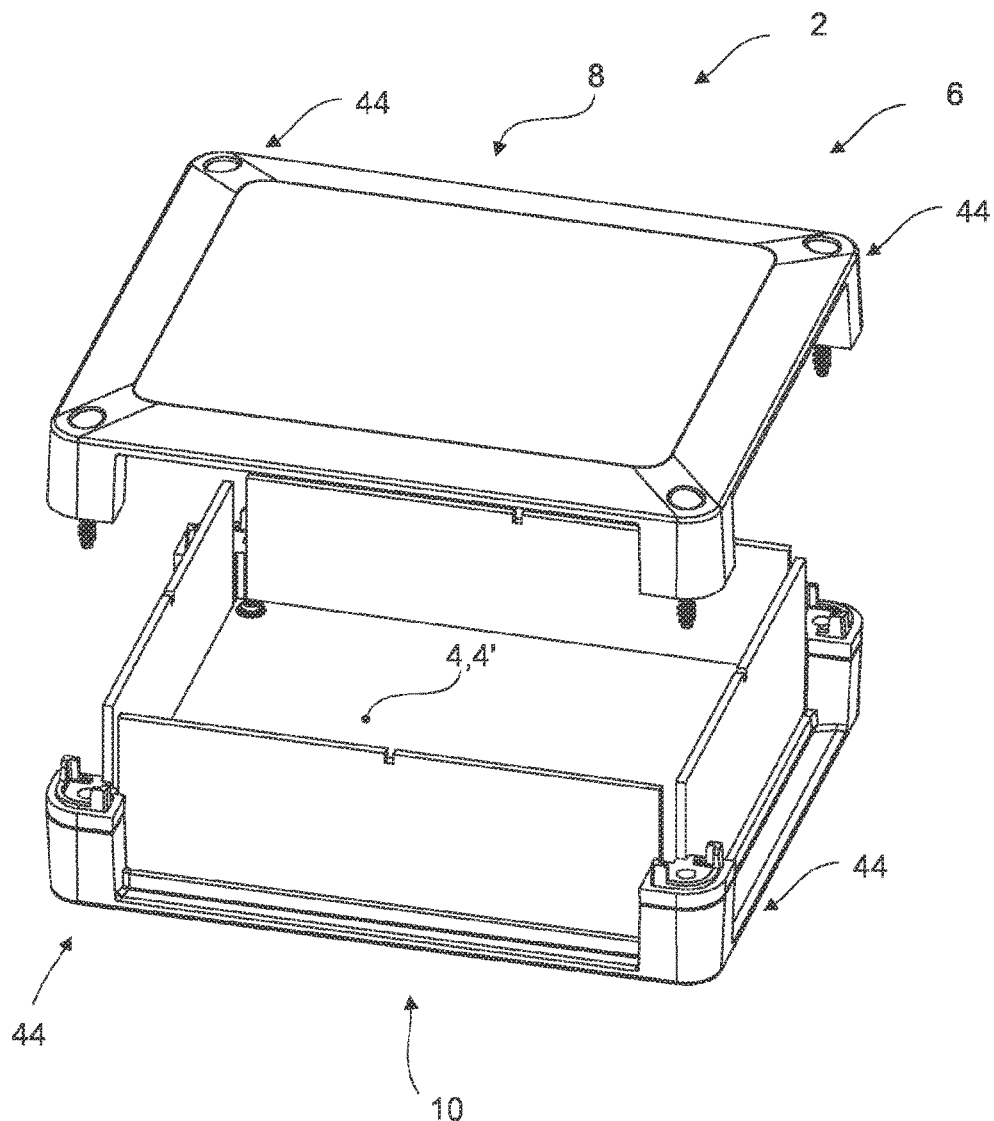
FIG. 2 shows the exemplary embodiment of an electronics housing according to the invention in a further similar perspective view and representation type as in FIG. 1.
Figure 3:
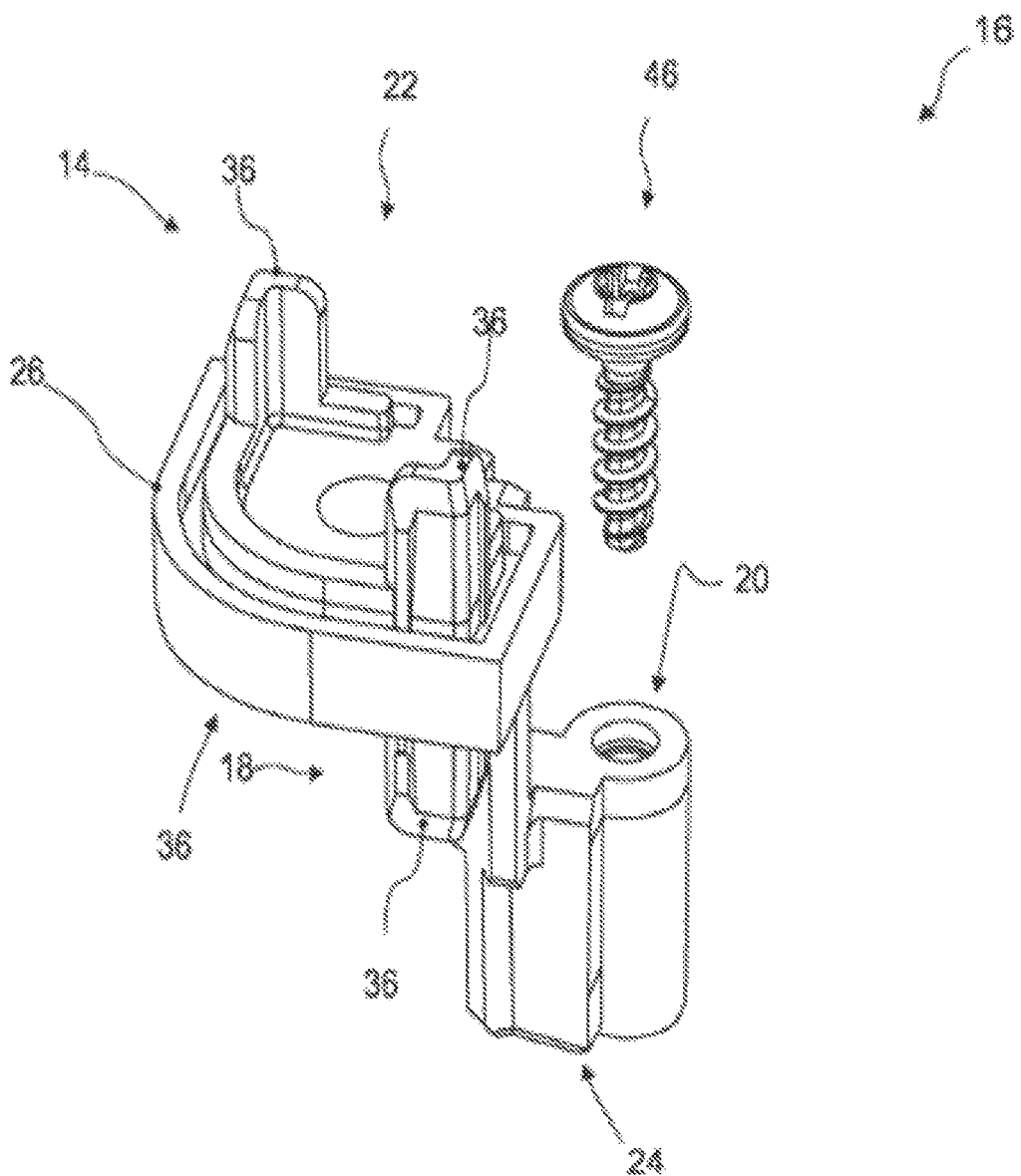
FIG. 3 shows the holding body of the exemplary embodiment of an electronics housing according to the invention in a perspective view and representation type similar to FIG. 1 but with a different scale.

In an embodiment, the present invention simplifies the holding of an electronic component in the receiving space and also to realize a variability which makes it possible to use an electronics housing according to the invention for various electronic components.

The invention departs from the idea of reshaping the housing body in a complicated manner or of providing a holding device to which the electronic component can be fastened at various positions in the receiving space in a predefined manner.

The invention, in a surprisingly simple manner, provides a holding device having at least one holding body designed as a single part with at least one holding arm, wherein the holding arm projects at least in sections from outside the receiving space into the receiving space and has or provides a holding section for holding the electronic component.

The invention has the advantage that different printed circuit boards can be held in the receiving space by means of holding bodies which are matched thereto. Furthermore, it is possible to simplify assembly by the holding device already being arranged on the electronic component before it is brought to the housing body.

In addition to the aforementioned advantages for (dis) assembly, time and cost advantages also arise. Furthermore, it is now possible to disassemble and thus separate the holding body from the housing body without any permanent damage so that recycling advantages likewise result.

Furthermore, with an electronics housing according to the invention, configurations which only emerge over time can also be inexpensively housed by only using adapted holding bodies to hold the electronic component and by the housing body as such not necessarily having to be changed.

Within the scope of the invention, the term "electronic component" covers an electrical/electronic component, an assembly consisting of electrical/electronic components, and also a combination of electronic components, such as a populated printed circuit board.

In addition, when identifying or describing the features of a housing according to the invention, a utilization state is assumed, wherein deviations therefrom are correspondingly described/identified or result from the particular context.

According to the invention, the utilization state is defined by the electronic component being arranged in the receiving space by means of the holding bodies and the upper housing part and the lower housing part being disposed on each other so as to form of the housing body and the electronic component thus being arranged at least between them.

Within the scope of the invention, it is possible, for example, to design an electronics housing according to the invention in such a way that it can be attached to a support rail or attached within a switchgear cabinet of an industrial installation so that the electronic component housed in an electronics housing according to the invention can be combined with other assemblies in order to, for example, perform controlling or evaluational functions within the context of an industrial installation.

The upper and lower housing parts can, for example, each be realized as housing halves which can be attached to each other in order to house the electronic component in the electronics housing. In this case, the electronic component is in particular initially arranged in the upper or lower housing part so that the electronics housing is closed by joining together the housing halves and the electronic component then housed in the receiving space of the housing body.

It is also within the scope of the invention for the housing body or the receiving space to have an opening through which the holding arm passes in such a way that a free end of the holding arm is disposed in the receiving space and another free end of the holding arm is disposed outside the receiving space. This opening can, for example and in particular, be formed in a side wall or a corner region of the housing body.

Within the scope of the invention, the fastening of the holding body can be effected in various ways, wherein an advantageous development of the invention provides for the holding body to be held on the housing body outside the receiving space.

This advantageously achieves the result that the receiving space does not necessarily have to be accessible for the mounting of the holding bodies. Fittings can thus, for example, already be arranged in the receiving space without them hindering the mounting of the holding bodies.

Furthermore, it is now possible for the electronic component to be removed from the receiving space independently of other fittings. This likewise facilitates disassembly of the electronic component.

The holding body can be held outside the receiving space in various ways.

An advantageous development of the invention makes provision for a first free end of the holding arm to be disposed outside the receiving space and a second free end of the holding arm to be disposed in the receiving space, wherein a base section is formed at the first free end of the holding arm and holds the holding arm on the housing body, and the holding section is formed at the second free end of the holding arm.

This results in the advantage that the base section can be designed to hold the holding body on the housing body in an in particular optimal/space-saving manner, as a result of which the housing body of a housing according to the invention can be optimally adapted to different applications, while the holding body can be adapted separately therefrom.

In order to simplify assembly of a housing according to the invention, the invention in a further advantageous development makes provision for the base section to be disposed between a connection region of the upper housing part and a corresponding connection region of the upper housing part, wherein the base section is held on the housing body by connecting the upper housing part to the lower housing part.

This results in advantages in assembly since the holding bodies require no separate fastening means and in the simplest case can be held between the upper housing part and the lower housing part by clamping forces. Within the scope of the invention, it is likewise possible to allow various degrees of freedom for the movement of the holding body on the housing body in order to be able to compensate for manufacturing tolerances or design changes.

Within the scope of the invention, however, in favor of the electronic component being held securely in the receiving space, it is preferred that the holding body be fixed to the housing body so that the holding body is fixedly arranged in relation to the housing body.

For this purpose, it is possible for the holding body to be held on the housing body, for example, by force-locking or by interlocking. Furthermore, it is possible to achieve holding of the holding body on the housing body by interlocking or by a combination of force-locking and/or interlocking and/or same-material direct bonding.

For this purpose, a further advantageous development of the invention makes provision for the holding body to be arranged by interlocking on the upper housing part and/or lower housing part, in particular by interlocking in a rotationally fixed manner. It is thereby achieved according to the invention that the holding body is secured against rotation in relation to the upper housing part and/or lower housing part.

This likewise ensures that the holding body is secured against rotation in a simple manner, which is independent of the joining forces acting between the upper housing part and the lower housing part in order to connect them to each other.

The aforementioned development of the invention preferably provides for the base section of the holding body to be configured and designed such that it is rotationally fixed by interlocking between the upper housing part and/or the lower housing part, as a result of which the holding body is secured against rotation in relation to the upper housing part and/or lower housing part and is thus arranged in a rotationally fixed manner.

When a screw connection is used to hold the printed circuit board onto the holding body, torques occur during the screwing process, which torques cause the holding body to twist, as a result of which the first free end is rotated or twisted in relation to the second free end. In order to prevent such a deformation, a further advantageous development of the invention makes provision for the holding section to be rotationally fixed to the housing body by interlocking, in particular to the upper housing part or lower housing part, and is thus arranged so as to be stiffening (torsionally stiffening) in relation to a twisting relative to the base section. As a result, assembly is significantly simplified, among other things.

In this case, it is likewise provided that both the base section and the holding section are rotationally fixed by interlocking, as a result of which twisting of the base section in relation to the holding section is effectively prevented. This likewise leads to a positionally secure holding of the electronic component in the receiving space.

In addition, twisting of the holding body about an axis of rotation, which is directed in parallel to the joining direction in which the upper housing part and the lower housing part are joined together, can be and is, for example and in particular, prevented.

Taking up this idea, a development of the invention building thereon makes provision for the holding body to have at least one pin or one hole which interacts with at least one corresponding hole or pin of the upper housing part and/or the lower housing part in order to rotationally fix the holding body. A simple and secure arrangement or holding of the holding body on the housing body is thus achieved. Within the scope of the invention, the hole is to be understood as a recess which can take the form of, for example, a through-hole or a blind hole.

A simplified holding of the holding body on the housing body is achieved according to the invention by providing a smallest possible surface to be held with the holding body. For this purpose, a further advantageous development of the invention makes provision for at least the connection region of the upper housing part to have a strut which extends from a cover side of the upper housing part in the direction of the lower housing part, wherein the base section of the holding body is arranged between the strut and the lower housing part.

This simplifies the manufacture of a housing according to the invention and also the arrangement and adaptation of the holding body or its base section for holding on the housing body.

In this context, a likewise advantageous development of the invention makes provision for at least the first connection region to have a strut which extends from a cover side of the lower housing part in the direction of the upper housing part, wherein the base section of the holding body is arranged between the strut and the upper housing part.

The advantages of cost-effective manufacture and arrangement of the holding body can be increased by the first connection region and the second connection region each having at least one strut whose respective free ends face each other, wherein the base section is arranged between the mutually facing ends. Within the scope of the invention, the aforementioned struts for holding the holding body correspond to each other and are thus assigned to each other.

In order to realize a broad range of utilization and a high adaptability of a housing according to the invention, a further advantageous development of the invention makes provision for the connection region of the upper housing part and the corresponding connection region of the lower housing part to be formed at one corner of the housing body.

The receiving space can thus be used almost without restriction for the arrangement of the electronic component.

In this sense, an advantageous development of the invention building thereon makes provision for a connection region of the upper housing part and a corresponding connection region of the lower housing part to be formed in each case on at least two spaced-apart corners of the housing body, thus correspondingly increasing the aforementioned advantage and the variable usability.

The usability of the receiving space can also be increased by arranging the holding section of the holding arm so as to face a cover side of the upper housing part or the lower housing part.

Within the scope of the invention, a cover side is to be understood as a side of the upper housing part or the lower housing part with which the receiving space is delimited in one direction so that the cover side of the upper or lower housing part forms a floor or a ceiling of the receiving space.

For this purpose, a development of the invention that seizes on this advantage makes provision for the holding section to be arranged at an offset in relation to the base section in the direction transverse to the longitudinal extent of the holding arm. This results in a kind of cranked or z-shaped design of the holding arm, whereby the base section and the holding section for the electronic component are spaced at different distances from the cover side of the upper housing part and the lower housing part. It is thus possible to arrange the electronic component in the vicinity of a cover side of the upper housing part or the lower housing part so that the distance from the cover side of the lower housing part is different from the distance from the cover side of the upper housing part and the electronic component is thus closer to one of the cover sides.

In order to attach the electronic component to the holding arm, a further advantageous development of the invention makes provision for the holding section to be configured and designed in such a way that the electronic component can be held or is held on the holding section by interlocking and/or by force-locking and/or by same-material direct bonding, in particular so as to be removable without permanent damage.

Within the scope of the invention, the electronic component can therefore be held in a variety of ways, as a result of which it can be designed as required. An interlocking or interlocking/force-locking holding is particularly advantageous, as a result of which the usability of a housing according to the invention is provided directly after completion of its assembly and the reusability of the individual parts is likewise made possible.

In this connection, a further advantageous development of the invention provides for the electronic component to be held on the holding section of the holding body by means of a screw-connection and/or a snap-on connection, whereby assembly and disassembly processes are simplified.

As already explained at the outset, an electronic component can be formed in various ways within the scope of the invention.

For this purpose, it is determined in a further advantageous development of the invention that the housing body be configured and designed to receive at least one printed circuit board in the receiving space, wherein the printed circuit board is arranged on at least one holding arm of a holding body. Accordingly, the holding body is also configured and designed to hold the printed circuit board.

In this way, compact designs result, as a result of which the available space can, for example, be utilized optimally.

In addition, a further advantageous development of the invention makes provision for the holding body to be configured and designed to hold a printed circuit board which is arranged on the holding body with a rectangular corner facing the holding body.

This results in particular in the advantage that a so-called printed circuit board panel, by means of which printed circuit boards are produced, can be used optimally and that cost savings are also achieved by simple production of the respective printed circuit board.

The invention is explained in more detail below with reference to the attached drawing, in which an exemplary embodiment of an electronics housing according to the invention, which is also used to illustrate a method according to the invention, is shown as a representative of a plurality of electronics housings according to the invention.

The figures in the drawing show a possible exemplary embodiment of an electronics housing according to the invention in a schematic representation in each case.

The illustrations in the figures are therefore in particular not necessarily to scale in relation to each other and for a better overview are reduced to the elements/parts/components promoting understanding.

In the figures, identical or corresponding parts/components or elements are provided with the same reference signs.

For a better overview, all elements/parts/components are not always provided with reference signs in the figures, wherein the assignment results from the same representation or a representation adapted to the view.

In the case of the same or a similar structure, for a better overview the description is reduced below to the differences between the exemplary embodiments or figures.

In this respect, the details of the exemplary embodiment shown in the figures of an electronics housing 2 according to the invention also complement each other so that the relevant details also apply overall in a corresponding or analogous manner to further electronics housings 2 formed according to the invention.

The exemplary embodiment of an electronics housing 2 according to the invention is also abbreviated below by the term "electronics housing 2".

FIG. 1 shows an exemplary embodiment of an electronics housing 2 according to the invention for housing an electronic component 4 in a perspective and schematic exploded view. In this exemplary embodiment, the electronic component 4 is a printed circuit board 4', which is shown highly schematically.

The electronics housing 2 is equipped with a housing body 6 which has an upper housing part 8 and a lower housing part 10, between which a receiving space 12 for the electronic component 4/circuit board 4' is formed, wherein the electronic component 4/circuit board 4' is held in the receiving space 12 by means of holding device 14.

In this exemplary embodiment, the holding device 14 in turn has four holding bodies 16 each of which has a holding arm 18, wherein the respective holding arm 18 projects at least in sections from outside the receiving space 12 into the receiving space 12 and provides a holding section 20 for holding the electronic component 4. Due to the chosen perspective, the respective components are not visible for each holding body 16. The same applies to further features described below with reference to the figures.

In this respect, the housing body 6 is configured and designed to receive at least one printed circuit board 4' in the receiving space 12, wherein the printed circuit board 4' is arranged on the respective holding arm 18 of a respective holding body 16.

The respective holding body 16 is held outside the receiving space 12 on the housing body 6. This is achieved by arranging a first free end 22 of the holding arm 18 outside the receiving space 12 and a second free end 24 of the holding arm 18 inside the receiving space 12, wherein a base section 26 is formed on the first free end 22 of the holding arm 18 and holds the holding arm 18 on the housing body 6, and the holding section 20 is formed on the second free end 24 of the holding arm 18.

Provision is furthermore made for the base section 26 to be arranged between a connection region 28 (each provided with the same reference sign) of the upper housing part 8 and a corresponding connection region 30 (each provided with the same reference sign) of the upper housing part 8, wherein the base section 26 is held on the housing body 6 by connecting the upper housing part 8 to the lower housing part 10.

For connecting the upper housing part 8 to the lower housing part 10, screws S are provided which, like their handling for connecting, require no further explanation so that a description of a screw connection process is dispensed with at this point.

The respective holding body 16 is arranged in an interlocking rotationally fixed manner on the upper housing part 8 and on the lower housing part 10 by means of the base section 26, as a result of which a rotation in relation to the housing body 6 is avoided and the holding body is therefore arranged in a correspondingly rotationally fixed manner.

In order to prevent twisting, provision is additionally made for the holding section 20 to be arranged in an interlocking rotationally fixed manner on the housing body 6, in particular on the upper housing part 8 or lower housing part 10.

For this purpose, stop elements 34 are formed on a cover side 32 of the lower housing part 10 and prevent the holding section 20 from being rotated by interlocking interaction with the latter. The stop elements 34 are uniformly provided with the same reference signs and are only visible at one location due to the chosen perspective.

For a rotationally fixed arrangement of the base section 26, each holding body 16 has four pins 36 (uniformly provided with the same reference sign), each of which interacts with a corresponding hole 38 (uniformly provided with the same reference sign) of the upper housing part 8 or the lower housing part 10 in order to rotationally fix the holding body (16), wherein two pins interact with holes in the upper housing part 8 and the other two pins interact with holes in the lower housing part 10. For a better overview, the pins 36 or the corresponding holes 38 are numbered only on one holding body 16 or connection region 28, 30.

Each of the connection regions 28 of the upper housing part 8 and of the lower housing part 10 has four struts 40 (uniformly provided with the same reference sign), each of which extends from their cover side 32, 32' in the direction of the corresponding other housing part 8, 10.

In this case, the struts 40 and the corresponding struts 40' face each other with their respective free ends 42, 42', wherein the base section 26 is arranged between the mutually facing ends 42, 42' of the struts 40, 40'.

FIG. 1 shows that the connection regions 28 of the upper housing part 8 and the corresponding connection region 30 of the lower housing part 10 are formed at a respective corner 44 (uniformly provided with the same reference sign) of the housing body 6, wherein the corners 44 are spaced apart from each other in particular in the circumferential direction of the housing body 6.

The respective holding section 20 of a respective holding arm 18 is arranged so as to face the cover side 32' of the lower housing part 10, as a result of which an optimal use of the receiving space 12 results. For this purpose, the respective holding section 20 is arranged at an offset in relation to the relevant base section 26 in a direction transverse to the longitudinal extent of the relevant holding arm 18. As a result, the holding body 16 has a kind of cranked shape.

Figure 4:
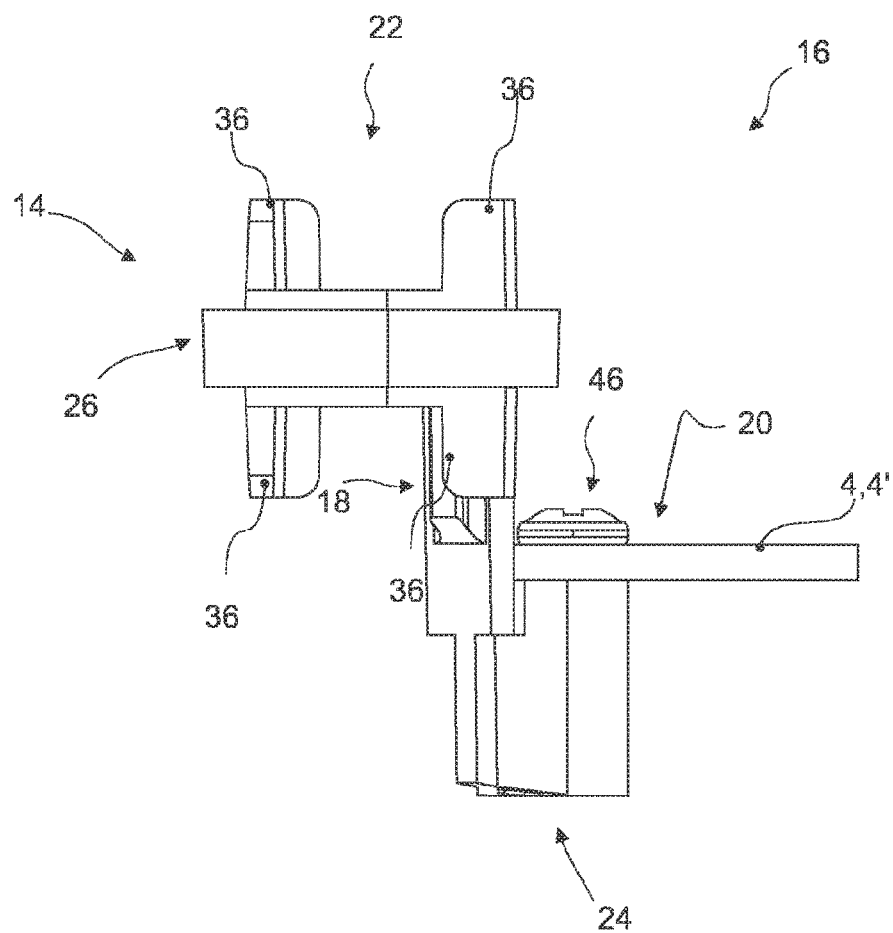
FIG. 4 shows the holding body of FIG. 3 with an electronic component or printed circuit board arranged thereon in a side view in a schematic type of representation but with a different scale.

In this exemplary embodiment of an electronics housing according to the invention, the respective holding sections 20 are configured and designed in such a way that the electronic component 4 is held on the holding section 20 by means of screw-connection 46 (illustrated in FIG. 4) in such a way that it can be removed without permanent damage.

FIG. 1 illustrates that the respective holding body 16 for holding the printed circuit board 4' is configured and designed with a rectangular corner 48 (uniformly provided with the same reference sign) facing the respective holding body 16.

It can be seen from FIG. 1 that the side walls 50 (uniformly provided with the same reference sign) of the housing body 6, which form a frame 52 for the receiving space 12 in their arrangement with respect to each other on the upper/lower housing part 8, 10, make a high degree of modularity possible, whereby different combinations of mutually different wall elements can be used for the respective intended application of an electronics housing 2. The further figures illustrate the features described above.

The idea underlying the invention is not limited to the exemplary embodiments described above but can also be realized in a completely different manner.

The features described with reference to the exemplary embodiment of an electronics housing according to the invention shown in the figures are therefore not bound thereto but can also form an electronics housing according to the invention in another configuration of features.

The invention discusses a broad range of applications for a previously described electronics housing.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. An electronic housing for housing an electronic component, comprising:
   a housing body having an upper housing part and a lower housing part, between which a receiving space for the electronic component is formed,
   wherein the electronic component is held in the receiving space by a holding device,
   wherein the holding device comprises at least one holding body with a holding arm,
   wherein the holding arm projects at least in sections from outside the receiving space into the receiving space and provides a holding section configured to hold the electronic component,
   wherein a holding body of the at least one holding body is designed as a single part,
   wherein a first free end of the holding arm is arranged outside the receiving space and a second free end of the holding arm is arranged in the receiving space,
   wherein the holding body comprises a base section and the base section is formed at the first free end of the holding arm and holds the holding arm on the housing body,
   wherein the base section is arranged between a connection region of the upper housing part and a corresponding connection region of the lower housing part,
   wherein the base section is held on the housing body by connecting the upper housing part to the lower housing part, and
   wherein the holding section is formed on the second free end of the holding arm.

2. The electronics housing according to claim 1, wherein the holding body is held outside the receiving space on the housing body.

3. The electronics housing according to claim 1, wherein the holding body is arranged by interlocking on the upper housing part and/or lower housing part.

4. The electronics housing according to claim 1, wherein the holding section is arranged in an interlocking rotationally fixed manner on the upper housing part or lower housing part.

5. The electronics housing according to claim 1, wherein the holding body comprises at least one pin or one hole which interacts with at least one corresponding hole or pin of the upper housing part and/or the lower housing part in order to rotationally fix the holding body.

6. The electronics housing according to claim 1, wherein at least the connection region of the upper housing part has a strut which extends from a cover side of the upper housing part in a direction of the lower housing part, and
   wherein the base section of the holding body is arranged between the strut and the lower housing part.

7. The electronics housing according to claim 1, wherein at least the connection region of the lower housing part has a strut which extends from a cover side in a direction of the upper housing part, and
   wherein the base section of the holding body is arranged between the strut and the upper housing part.

8. The electronics housing according to claim 1, wherein the connection region of the upper housing part and the corresponding connection region of the lower housing part each have at least one strut, respective free ends of which face each other, and
   wherein the base section is arranged between mutually facing ends of the struts.

9. The electronics housing according to claim 1, wherein the connection region of the upper housing part and the corresponding connection region of the lower housing part are formed at a corner of the housing body.

10. The electronics housing according to claim 1, wherein the connection region of the upper housing part and the corresponding connection region of the lower housing part are in each case formed on at least two spaced-apart corners of the housing body.

11. The electronics housing according to claim 1, wherein the holding section of the holding arm is arranged so as to face a cover side of the upper housing part or the lower housing part.

12. The electronics housing according to claim 1, wherein the holding section is arranged at an offset in relation to the base section in a direction transverse to a longitudinal extent of the holding arm.

13. The electronics housing according to claim 1, wherein the holding section is configured such that the electronic component is holdable on the holding section by interlocking and/or by force-locking and/or by same-material direct bonding so as to be removable without permanent damage.

14. The electronics housing according to claim 1, wherein the electronic component is held on the holding section of the holding body by a screw-connection and/or a snap-connection.

15. The electronics housing according to claim 1, wherein the housing body is configured to receive at least one printed circuit board in the receiving space, and
   wherein the at least one printed circuit board is arrangeable on the holding arm of the holding body.

16. The electronics housing according to claim 1, wherein the holding body is configured to hold a printed circuit board on a rectangular corner of the printed circuit board facing the holding body.

* * * * *